(12) United States Patent
Uusipaikka

(10) Patent No.: US 8,439,080 B2
(45) Date of Patent: May 14, 2013

(54) PRESSURE COMPENSATOR

(75) Inventor: Usko Uusipaikka, Vaasa (FI)

(73) Assignee: ABB Technology AG, Zürich (CH)

( * ) Notice: Subject to any disclaimer, the term of this patent is extended or adjusted under 35 U.S.C. 154(b) by 132 days.

(21) Appl. No.: 13/071,125

(22) Filed: Mar. 24, 2011

(65) Prior Publication Data
US 2011/0226369 A1    Sep. 22, 2011

Related U.S. Application Data

(63) Continuation of application No. PCT/FI2009/050741, filed on Sep. 16, 2009.

(30) Foreign Application Priority Data

Sep. 24, 2008  (EP) .................................... 08164976
Mar. 16, 2009  (EP) .................................... 09155223

(51) Int. Cl.
*F16L 55/04* (2006.01)

(52) U.S. Cl.
USPC ............................................. 138/30; 138/26

(58) Field of Classification Search .............. 138/26, 138/30; 220/720, 723, 530; 237/66
See application file for complete search history.

(56) References Cited

U.S. PATENT DOCUMENTS

| | | | | |
|---|---|---|---|---|
| 4,997,009 A | * | 3/1991 | Niikura et al. ................... | 138/30 |
| 5,618,629 A | * | 4/1997 | Takamatsu et al. ......... | 428/475.5 |
| 5,797,430 A | * | 8/1998 | Becke et al. .................... | 138/30 |
| 5,893,681 A | | 4/1999 | Boden et al. | |
| 6,041,820 A | * | 3/2000 | Boehme ........................... | 138/30 |
| 6,056,013 A | * | 5/2000 | Sasaki et al. ..................... | 138/31 |
| 2003/0075225 A1 | * | 4/2003 | Dinkel et al. .................... | 138/31 |
| 2004/0051615 A1 | | 3/2004 | Hafskjold et al. | |
| 2007/0074872 A1 | | 4/2007 | Du et al. | |

FOREIGN PATENT DOCUMENTS

| | | |
|---|---|---|
| CN | 201054295 Y | 4/2008 |
| EP | 0281685 A1 | 9/1988 |
| GB | 1023452 A | 3/1966 |

(Continued)

OTHER PUBLICATIONS

International Search Report (PCT/ISA/210) issued on Dec. 18, 2009, by Finnish Patent Office as the International Searching Authority for International Application No. PCT/FI2009/050741.

(Continued)

*Primary Examiner* — Patrick F Brinson
(74) *Attorney, Agent, or Firm* — Buchanan Ingersoll & Rooney PC

(57) ABSTRACT

A pressure compensator is configured to compensate for volume variations of an insulation medium or other liquid of a subsea installation. The pressure compensator includes a first bellows chamber having a first bellows part. The first bellows chamber is in flow connection with an insulation medium or liquid chamber of the subsea installation, and the walls of the first bellows chamber are configured to separate the insulating medium from surroundings. The first bellows chamber is surrounded by a second bellows chamber having an end wall, a side wall and a second bellows part formed by a diaphragm. The second bellows chamber is configured to form a closed intermediate space around the first bellows chamber. The walls of the second bellows chamber are configured to separate at least the bellows parts of the first bellows chamber from the surrounding water. The second bellows chamber is filled with an intermediate medium.

11 Claims, 2 Drawing Sheets

FOREIGN PATENT DOCUMENTS

| | | |
|---|---|---|
| JP | 56-162815 A | 12/1981 |
| JP | 6-310343 A | 11/1994 |
| JP | 9-176766 A | 7/1997 |
| JP | 2000-46181 A | 2/2000 |
| WO | WO 2007/055588 A1 | 5/2007 |

OTHER PUBLICATIONS

Written Opinion (PCT/ISA/237) issued on Dec. 18, 2009, by Finnish Patent Office as the International Searching Authority for International Application No. PCT/FI2009/050741.

European Search Report dated May 5, 2009 for European Application No. 08164976.6.

International Search Report (PCT/ISA/210) issued on Dec. 18, 2009, by Finnish Patent Office as the International Searching Authority for International Application No. PCT/FI2009/050740.

Written Opinion (PCT/ISA/237) issued on Dec. 18, 2009, by Finnish Patent Office as the International Searching Authority for International Application No. PCT/FI2009/050740.

Official Action mailed Nov. 21, 2012 issued by the U.S. Patent and Trademark Office in corresponding U.S. Appl. No. 13/071,114.

\* cited by examiner

PRESSURE COMPENSATOR

RELATED APPLICATIONS

This application claims priority as a continuation application under 35 U.S.C. §120 to PCT/FI2009/050741, which was filed as an International Application on Sep. 16, 2009 designating the U.S., and which claims priority to European Application 08164976.6 filed in Europe on Sep. 24, 2008 and European Application 09155223.2 filed in Europe on Mar. 16, 2009. The entire contents of these applications are hereby incorporated by reference in their entireties.

FIELD

The present disclosure relates to a pressure compensator configured to compensate for volume variations of an insulation medium or other liquid of a subsea installation.

Subsea installations are assemblies used under water. Such assemblies can be installed, for example, on the bottom ground of a body of water. Power transformers are an example of subsea installations which can be used under water. Generally, power transformers use an insulation medium. For example, the power transformers can be fluid insulated having transformer oil in a transformer tank, for example. Examples of other subsea liquid filled objects are subsea motors, subsea switchgears, subsea converters, rectifiers and hydraulic store tanks.

The subsea installations described above are used, for example, in modern oil and gas production in which the collection, separation, boosting and transport of production fluids takes place on the seabed. These processes require large amounts of power that has to be transferred from a remote location at suitable voltages and currents to achieve minimum power loss, to the subsea installations. The transport of the power can take place at high voltages and low current to ensure minimum losses. When the power arrives at the subsea location, the power has to be transformed into more usable voltages and currents for the various specific subsea applications, such as for example the powering of pumps and compressors, for example.

The large power requirements result in the need for large transformers to be placed in a protective environment inside a large vessel, e.g., a tank. The transformer tank is filled with an insulating medium that ensures optimal working conditions for the transformer over many years. Transformer oil that contributes towards dissipating heat and preventing shorts and flashovers is a common example of such an insulating medium. In new big subsea transformers the size of the transformer tank can be in the order of 10-30 cubic meters containing 10,000-30,000 liters of transformer oil. The water temperature variations, heat produced by the transformer and the properties of typical transformer oil result in oil volume variation in the order of several hundred liters or more. As the size of a transformer tank increases, the problems and need of compression and expansion also increase accordingly.

Subsea installations such as subsea transformers need pressure compensators to keep the pressure of the insulation medium used, for example the pressure of oil inside the transformer, close to the water pressure outside the transformer to avoid heavy mechanical structures against pressure. Also, cooling is easier when thinner wall thickness can be applied. The hydrostatic pressure of the water will increase circa 10 bars for each 100 m water depth increase, and the pressure difference between the oil inside and the water outside should typically be less than 1 bar. The subsea transformers filled with insulation oil will be exposed to oil compression and expansion due to temperature variation of the surrounding, due to load variation also causing a variation of the oil temperature and due to hydrostatic pressure of the sea water. The oil volume variation due to temperature variation is caused by a property of the oil having a non-zero thermal expansion coefficient, and the oil volume variation due to pressure variation is caused by close to zero pressure-volume coefficient of the oil.

From the point of view of construction and reliability, the transformer vessels or other equipment tanks described above are known to be rigid and constant volume structures. When transformer or equipment sizes are increasing, this means that the pressure inside the transformer or other equipment must be close to water pressure around the transformer or the other equipment. Owing to the factors above, the subsea transformers or the other equipment are equipped with one or several pressure compensators to keep the oil pressure inside the transformer close to the water pressure outside the transformer. The pressure compensators are structures with variable volume oil or other liquid filled containers outside the transformer or the other equipment. The variable volume containers are also in flow connection with the transformer oil space or the other equipment liquid space.

There are several different solutions for subsea pressure compensators. WO 2007/055588 A1 and US Patent Application US 2004/0051615 A1 are examples of known solutions. All known subsea pressure compensators, such as those mentioned above, for example, have only one wall or barrier between the sea water and the oil inside. This means that if one barrier or wall will have a failure producing leakage between the oil and the water, the water will enter into the transformer causing electrical failure of the transformer and thereby affect the operation of the transformer. The other equipment will have also serious consequences such as electrical failures if the water will leak in. Such leak problems relate mainly to corrosion caused by the sea water, because known pressure compensators are not particularly resistant against corrosion caused by sea water. The sensitivity of the corrosion may be a risk with metallic bellows type pressure compensators because the wall of the bellows should be very thin to reach required flexibility. This may be the situation even when cathodic protection will be used.

There are also known solutions with which properties of different bellows structures against corrosion are improved. JP 9176766, JP 2000046181, EP 0 281 685 and U.S. Pat. No. 5,893,681 are examples of such solutions. These known solutions are not, however, suitable in subsea conditions.

SUMMARY

An exemplary embodiment of the present disclosure provides a pressure compensator configured to compensate for volume variations of an insulation medium or other liquid of a subsea installation. The exemplary pressure compensator includes a first bellows chamber and a second bellows chamber surrounding the first bellows chamber. The first bellows chamber includes first walls and a first bellows part. The first bellows chamber is in flow connection with an insulation medium or liquid chamber of the subsea installation. The first walls of the first bellows chamber are configured to separate the insulating medium from surrounding sea water. The second bellows chamber includes an end wall, a side wall and a second bellows part formed by a diaphragm. The second bellows chamber is configured to form a closed intermediate space around the first bellows chamber. The end and side walls of the second bellows chamber are configured to separate at least the first bellows parts of the first bellows chamber from the surrounding water. The second bellows chamber is filled with an intermediate medium.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Exemplary embodiments of the present disclosure provide a pressure compensator which eliminates the problems of the known solutions. Exemplary embodiments of the present disclosure provide a pressure compensator in which a first bellows chamber is surrounded by a second bellows chamber. The second bellows chamber includes an end wall, a side wall and a second bellows part formed by a diaphragm. The second bellows chamber is configured to form a closed intermediate space around the first bellows chamber. The walls of the second bellows chamber are configured to separate at least the bellows parts of the first bellows chamber from the surrounding water. The second bellows chamber is filled with an intermediate medium.

Exemplary embodiments of the present disclosure advantageously eliminate the problems relating to sea water corrosion. The present disclosure is also simple and therefore manufacturing and maintenance costs are low.

Figure 1:
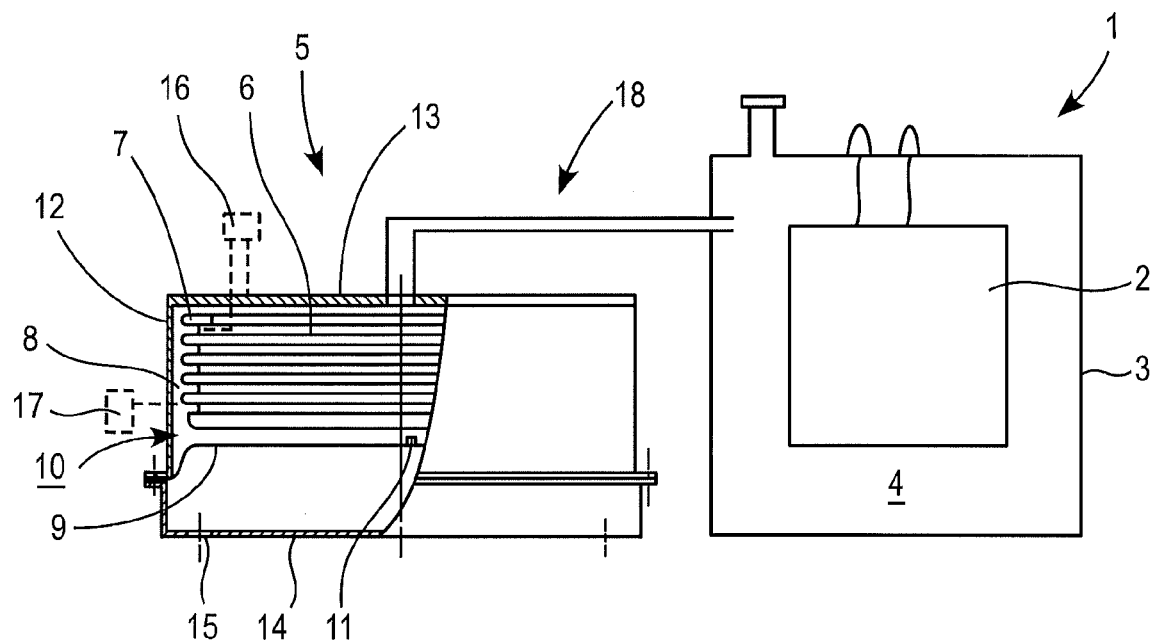
FIG. 1 shows schematically the basic structure and operation principle of a pressure compensator according to an exemplary embodiment of the present disclosure.

FIG. 1 shows schematically the basic structure of an exemplary embodiment of the present disclosure and how the present disclosure operates in connection with a subsea installation. In the example of FIG. 1, the subsea installation is a subsea transformer. Reference number 1 shows generally the subsea transformer. The subsea transformer 1 includes a transformer unit 2 and a tank 3. The tank 3 is filled with insulation medium, e.g., transformer oil. The tank 3 forms an insulation chamber around the transformer unit 2.

A pressure compensator 5 is provided in order to compensate for volume variations of the insulating medium 4. The pressure compensator 5 includes a first bellows chamber 6. The first bellows chamber 6 includes a first bellows part 7. The first bellows part 7 is made of a suitable material, for example, steel.

The first bellows chamber 6 is arranged through a pipe or channel system 18 in flow connection with the insulation chamber formed by the tank 3 so that the first bellows chamber 6 can compensate for volume variations of the insulating medium 4.

The assembly shown in FIG. 1 is wholly surrounded with sea water, e.g., the assembly is placed on the bottom of the sea.

The aforementioned features illustrated in FIG. 1 are known in the art and are therefore not described herein in further detail.

As noted above, the drawbacks with known solutions relate to corrosion damages in the bellows part of the pressure compensator, e.g., surrounding water, for example surrounding sea water causes corrosion problems in the first bellows part.

According to an exemplary embodiment of the present disclosure, the first bellows chamber 6 is surrounded by a second bellows chamber 8, which includes an end wall 13, a side wall 12 and a second bellows part 9 formed by a diaphragm 9. The second bellows chamber 8 is configured to form a closed intermediate space around the first bellows chamber 6. The walls 13 and 12, and the diaphragm 9 of the second bellows chamber 8 are configured to separate at least the bellows parts 7 of the first bellows chamber 6 from the surrounding sea water. The second bellows chamber 8 is filled with an intermediate medium 10. The second bellows part 9, e.g., the diaphragm 9, of the second bellows chamber 8 can be made of a material resistant to surrounding sea water, for example.

In other words, the expansive and compressive element of the pressure compensator has two barriers or walls between transformer related space and seawater.

The inner barrier, e.g., the first bellows part 7 in FIG. 1, is made of metallic bellows construction, and the outer barrier, e.g., the second bellows part, the diaphragm 9, etc. in FIG. 1, is made of rubber material or rubber like material. The rubber like material can be, for example, appropriate plastic material or a mixture with rubber material and plastic material. The space between the first bellows part 7 and the second bellows part 9, e.g., the second bellows chamber 8, is filled with the same transformer oil or oil which is mixable with the transformer oil 4 in the first bellows chamber 6 and in the tank 3. There is, however, no exchange of oil through the first bellows part 7.

The second bellows part, e.g, the diaphragm 9, made of rubber material or other similar material protects the first bellows part 7 made of metal material from corrosion. In this regard, it is important to realise that the first bellows part 7, due to desired flexibility, must have a typically thin wall construction, and therefore corrosion matters are very important with regard to the operation of the device. The wall thickness of the first bellows part 7 can be in 1 mm scale, for example. In order to have more flexibility and reliability, the first bellows part 7 can also be constructed with one or more metallic layers.

The small volume changes of the closed intermediate oil space, e.g., the second bellows chamber 8 between the first and the second bellows parts must also be compensated. According to an exemplary embodiment of the present disclosure, this is carried out by the second bellows part e.g. the diaphragm 9, and therefore an additional pressure compensator connected to the intermediate space is not needed.

The rubber material used in the second bellows part, e.g. the diaphragm 9 can, for example, be Nitrile rubber, which is resistant against sea water and after suitable treatment compatible with the transformer oil as well.

The second bellows part, e.g. the diaphragm 9, can be made wholly of the rubber or rubber like material. It is, however, quite possible to put appropriate strengthening material or several strengthening materials into/to the diaphragm material, for example inside of the diaphragm 9 or/and on the surface of the diaphragm 9 as shown with reference number 11, for example, in FIG. 1.

The other walls of the pressure compensator, which are not changing their shape and size, for example side wall 12 of tubular form and end wall 13 can be made, for example, of thick enough one layer metallic material, such as stainless steel plates, for example. The walls can, however, be, for example, two-layer construction like rubber material/metal material walls.

According to an exemplary embodiment, the pressure compensator of the present disclosure can also be provided with guiding rods for guiding the first bellows parts to move during compression and/or expansion along defined paths. The guiding rod may be placed into the second bellows chamber whereby the guiding rods are well protected against dirt and debris. The number of these guiding rods can be chosen freely according to the existing need. It is however quite possible also to materialize the pressure compensator without the guiding rods, as shown in the drawings.

Figure 2:
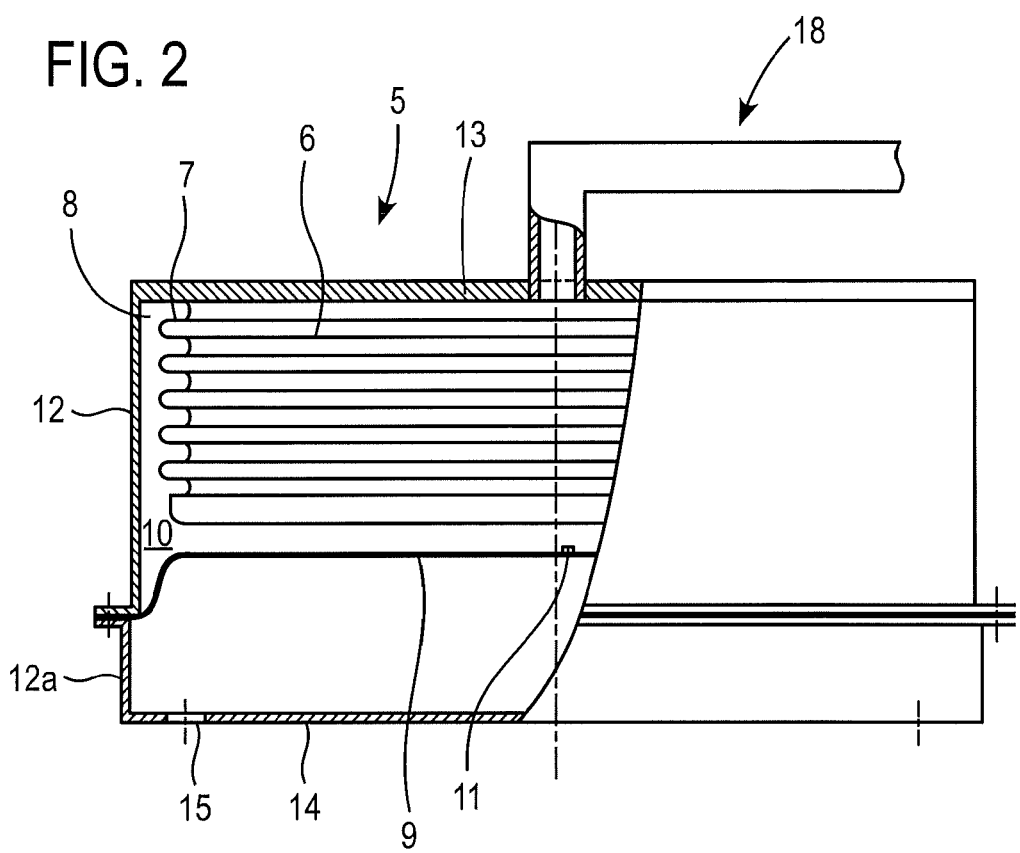
FIG. 2 is a sectional drawing showing an exemplary pressure compensator of the present disclosure in a compressed situation.
Figure 3:
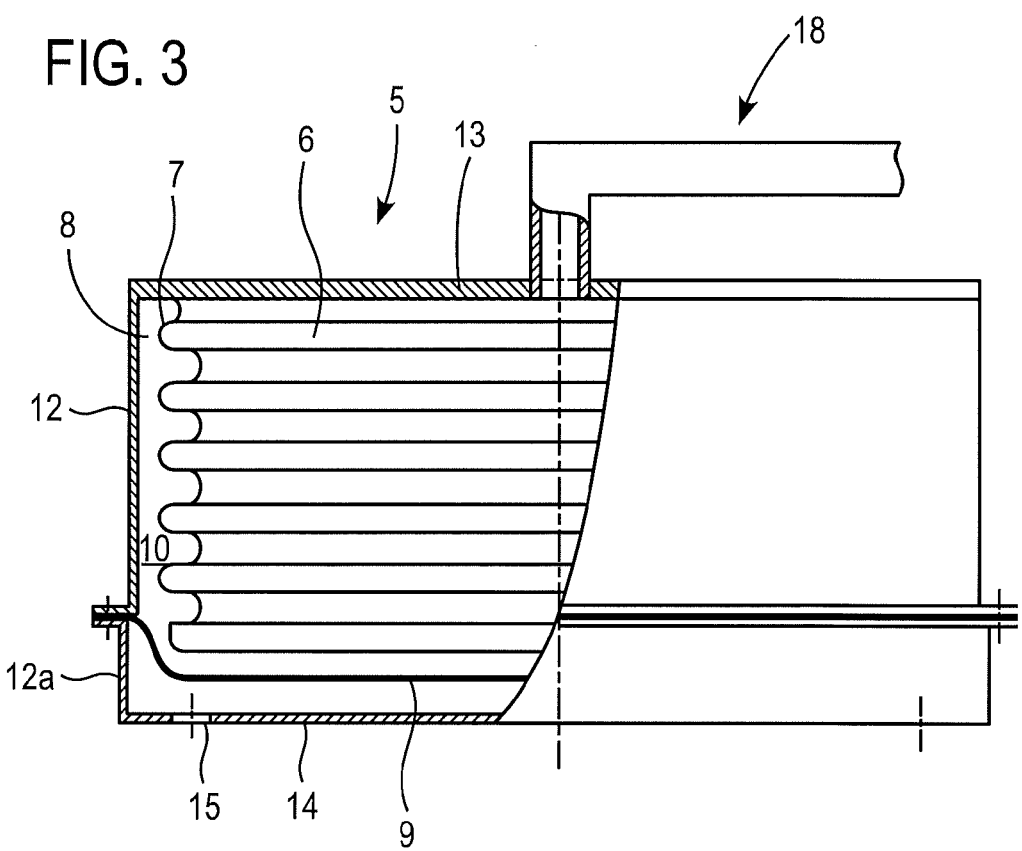
FIG. 3 is a sectional drawing showing an exemplary pressure compensator of the present disclosure in an expanded situation.

FIGS. 2 and 3 are sectional drawings showing an exemplary embodiment of the pressure compensator of the present disclosure in a compressed situation (FIG. 2) and in an expanded situation (FIG. 3). The reference numbers used in FIGS. 2 and 3 correspond to the reference numbers used in FIG. 1. The first bellows chamber is filled with the insulating medium 4, and the second bellows chamber 8 is filled with the intermediate medium 10. In the exemplary embodiment of FIGS. 2 and 3, the space under the diaphragm 9 is formed by an element formed by a bottom wall 14 and a side wall part 12a which is a cylindrical part in the illustrated exemplary embodiment. The side wall part 12a forms an extension of the side wall 12. This element is made of, for example, metal material. The space formed by the diaphragm 9, the bottom wall 14 and the side wall part 12a is filled with surrounding water, for example sea water, flowing through an orifice 15 provided in the bottom wall 15. In the exemplary embodiment of FIGS. 2 and 3, the orifice 15 is made to the bottom wall 14. The orifice 15 can, however, be made so that surrounding water, for example sea water, flows through the side wall part 12a or through both the bottom wall 15 and side wall part 12a. Several orifices 15 arranged to the bottom wall 15 or/and side wall part 12a can also be used instead of the one shown in FIGS. 2 and 3.

The element forming the space under the diaphragm 9 is not a critical element. In other words, exemplary embodiments of the present disclosure can be implemented without this element, whereby the outer surface of the diaphragm 9 is faced freely to the open surrounding water, for example sea water. The element described above is, however, advantageous in forming an efficient mechanical safety cover to the diaphragm 9 and offering excellent and simple fastening properties to the diaphragm 9.

As described above, the pressure compensator 5 compensates for volume variations of the insulating medium 4. The first bellows part 7 of the first bellows chamber 6 takes care of the volume variations in the insulating medium, e.g., the first bellows part 7 is compressed or expanded according to the volume variations in the insulating medium. FIG. 2 shows the first bellows part 7 in a compressed situation, and FIG. 3 shows the first bellows part 7 in an expanded situation.

As described above, there exists small volume changes in the intermediate medium 10, and these small volume changes in the intermediate medium 10 must also be compensated. In accordance with an exemplary embodiment of the present disclosure, the small volume changes of the intermediate medium 10 can be compensated by using the second bellows part, e.g., the diaphragm 9, and therefore no additional pressure compensator connected to the intermediate space 8 is needed. No additional pressure compensator is needed because in accordance with exemplary embodiments of the present disclosure, the volume of the intermediate space 8 changes according to the volume changes of the intermediate medium 10, e.g., the diaphragm 9 is flexible and moves in the way as shown in FIGS. 2 and 3, and therefore the volume of the intermediate chamber is changed automatically according to the volume changes of the intermediate medium 10.

The number of the pressure compensators connected parallel to the subsea installation, for example to the subsea transformer or to some other possible object to be compensated, is selected so that the total oil volume required can be compensated.

The pressure compensator can also include electrically based corrosion protection means or some other type of corrosion protection means. This corrosion protection means can be situated also inside the pressure compensator to protect the first bellows part made of metal material. Reference number 16 in FIG. 1 shows schematically the corrosion protection means.

The pressure compensator of the present disclosure can also be provided with monitor means for monitoring the amount of surrounding water, for example sea water eventually leaked into the intermediate space, e.g., into the second bellows chamber 8. Reference number 17 in FIG. 1 shows the monitoring means.

Figure 4:
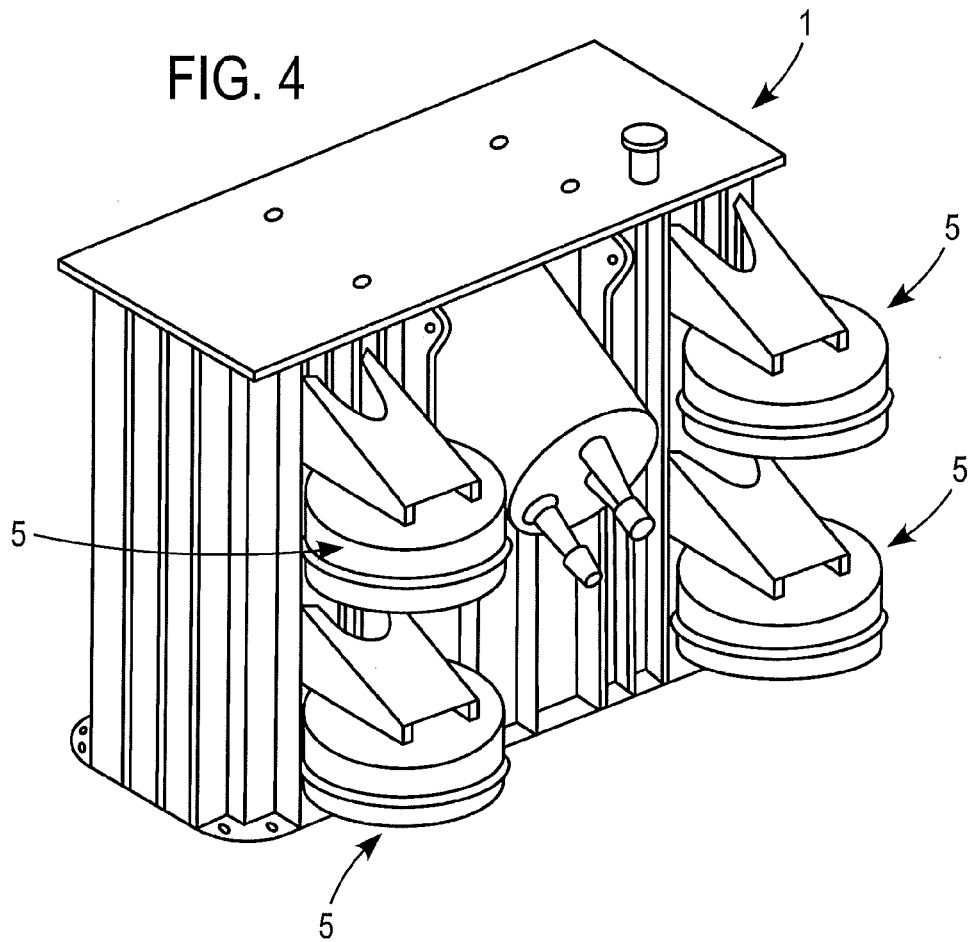
FIG. 4 shows schematically a subsea transformer provided with pressure compensators according to an exemplary embodiment of the present disclosure.

As discussed above, the number of the pressure compensators used in connection with a subsea installation can vary according to the existing need. For example, the compensation volume of the pressure compensators required in near future big subsea transformers in hundreds of liters, for example 200 liters, and typical number of compensators needed in one big subsea transformer is from 2 to 6 compensator units. As an example, FIG. 4 shows a subsea transformer with four pressure compensators 5.

The embodiments described above are not intended to restrict the disclosure but only to clarify the basic idea of the invention. It is quite clear that details can be varied freely within the scope of the claims. The disclosure is described here in connection with subsea transformers. The disclosure is however not restricted solely to subsea transformers but the disclosure can also be used in connection with all subsea installations using insulation medium and needing compensation of said insulation medium etc. Insulation medium need not be transformer oil but any other medium or fluid can be used according to the existing need.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A pressure compensator configured to compensate for volume variations of an insulation medium or other liquid of a subsea installation, comprising:
   a first bellows chamber including a first wall and a first bellows part, the first bellows chamber for being in flow connection with an insulation medium or liquid chamber of the subsea installation, the first wall of the first bellows chamber being configured to separate the insulating medium from surrounding sea water; and
   a second bellows chamber surrounding the first bellows chamber, the second bellows chamber defined by an end wall, a side wall and a second bellows part formed by a diaphragm, the end wall, side wall and diaphragm forming a closed intermediate space around the first bellows chamber, the end and side walls of the second bellows chamber being configured to separate at least the first bellows parts of the first bellows chamber from the surrounding water, and the second bellows chamber being filled with an intermediate medium.

2. The pressure compensator of claim 1, wherein the second bellows part of the second bellows chamber is made of a material resistant to the surrounding water.

3. The pressure compensator of claim 2, wherein the second bellows part is made of one of rubber, plastic material, and a mixture of the rubber and plastic material.

4. The pressure compensator of claim 1, wherein the second bellows part of the second bellows chamber is configured to compensate for volume changes of the intermediate medium.

5. The pressure compensator of claim 1, wherein the intermediate medium is one of the same medium as the insulation medium of the subsea installation, and a medium mixable with the insulation medium of the subsea installation.

6. The pressure compensator of claim 3, wherein the second bellows part comprises strengthening material or materials.

7. The pressure compensator of claim 1, wherein the intermediate space comprises measuring elements configured to monitor eventual amount of surrounding water in the intermediate space.

8. The pressure compensator of claim 1, wherein the pressure compensator comprises a corrosion protecting means.

9. The pressure compensator of claim 1, wherein the subsea installation is a subsea transformer.

10. The pressure compensator of claim 1, wherein the insulation medium is transformer oil.

11. The pressure compensator of claim 1, wherein the diaphragm is covered with an element comprising a bottom end wall and a side wall part, the element being provided with an orifice or orifices for surrounding water.

* * * * *